(12) United States Patent
Lai et al.

(10) Patent No.: US 8,451,078 B2
(45) Date of Patent: May 28, 2013

(54) CMOS-MEMS SWITCH STRUCTURE

(75) Inventors: You-Liang Lai, Hsinchu (TW);
Ying-Zong Juang, Hsinchu (TW);
Hann-Huei Tsai, Hsinchu (TW);
Sheng-Hsiang Tseng, Hsinchu (TW);
Chin-Fong Chiu, Hsinchu (TW)

(73) Assignees: National Chip Implementation Center, Hsinchu (TW); National Applied Research Laboratories, Hsinchu (TW)

( * ) Notice: Subject to any disclaimer, the term of this patent is extended or adjusted under 35 U.S.C. 154(b) by 140 days.

(21) Appl. No.: 13/160,742

(22) Filed: Jun. 15, 2011

(65) Prior Publication Data

US 2012/0279838 A1  Nov. 8, 2012

(30) Foreign Application Priority Data

May 6, 2011 (TW) .............................. 100115853 A

(51) Int. Cl.
*H01H 51/22* (2006.01)
*H01H 57/00* (2006.01)

(52) U.S. Cl.
USPC ............................................ 335/78; 200/181

(58) Field of Classification Search
USPC ............................................ 335/78; 200/181
See application file for complete search history.

(56) References Cited

U.S. PATENT DOCUMENTS

| | | | |
|---|---|---|---|
| 6,191,671 B1 * | 2/2001 | Schlaak et al. | 335/78 |
| 6,396,368 B1 * | 5/2002 | Chow et al. | 333/262 |
| 7,215,229 B2 * | 5/2007 | Shen et al. | 335/78 |
| 8,068,002 B2 * | 11/2011 | Shen | 335/78 |
| 2006/0003482 A1 * | 1/2006 | Chinthakindi et al. | 438/52 |

* cited by examiner

*Primary Examiner* — Mohamad Musleh
(74) *Attorney, Agent, or Firm* — Juan Carlos A. Marquez; Stites & Harbison PLLC

(57) ABSTRACT

A CMOS-MEMS switch structure is disclosed. The CMOS-MEMS switch structure includes a first substrate, a second substrate, a first cantilever beam, and a second cantilever beam. The first and second substrates are positioned opposite each other. The first cantilever beam is provided on the first substrate, extends from the first substrate toward the second substrate, and bends downward. Likewise, the second cantilever beam is provided on the second substrate, extends from the second substrate toward the first substrate, and bends downward. The first and second substrates are movable toward each other to connect a first top surface of the first cantilever beam and a second top surface of the second cantilever beam, and away from each other so that the first top surface of the first cantilever beam and the second top surface of the second cantilever beam are disconnected, thereby closing or opening the CMOS-MEMS switch structure.

12 Claims, 5 Drawing Sheets

CMOS-MEMS SWITCH STRUCTURE

BACKGROUND OF THE INVENTION

1. Technical Field

The present invention relates to a microelectromechanical system (MEMS) switch structure and, more particularly, to a CMOS (complementary metal-oxide-semiconductor)-MEMS switch structure featuring integration of CMOS and MEMS technologies.

2. Description of Related Art

A switch for use in a telecommunication system must have high isolation and low insertion loss to prevent the system from noise interference and maintain system performance. Mechanical switches, for example, are preferred in telecommunication systems where high-frequency operation is required. Besides, as it is generally required that switches in a telecommunication system be more and more compact and lightweight, CMOS-MEMS switches which feature total compatibility with CMOS manufacturing processes have been developed.

Typically, a CMOS-MEMS switch incorporating both CMOS and MEMS manufacturing processes is made by first performing a standard CMOS manufacturing process, then defining the desired MEMS element areas with a photoresist, and releasing the defined MEMS elements by etching. However, as the major metal used in the CMOS manufacturing process is aluminum, which tends to oxidize and become an electrically insulating aluminum oxide when exposed to air, the surface electrodes of the resultant CMOS-MEMS switch elements may contact each other without effectively making electrical connection therebetween.

Please refer to FIG. 1 for a schematic drawing of a conventional CMOS-MEMS switch structure 100 configured to be closed (i.e., turned on) by lateral contact between surface electrodes 122 and 142 on the cantilever beams 12 and 14, wherein the cantilever beams 12 and 14 serve as a contact switch in the CMOS-MEMS switch structure 100. When making the lateral contact-based CMOS-MEMS switch structure 100, the line width limitations of existing MEMS manufacturing processes prevents the two opposing ends of the cantilever beams 12 and 14 from being in close proximity. As a result, it is difficult for the surface electrode 122 on the top surface of the cantilever beam 12 and the surface electrode 142 on the top surface of the cantilever beam 14 to make electrical contact with each other. Moreover, if the cantilever beams 12 and 14 have such a poor structural design that both cantilever beams bend upward, the distance between the aforesaid two ends of the cantilever beams 12 and 14 will be further increased. Therefore, the manufacture of the lateral contact-based CMOS-MEMS switch structure 100 still has many problems to be solved.

BRIEF SUMMARY OF THE INVENTION

It is an object of the present invention to provide a CMOS-MEMS switch structure whose surface electrodes are made of an oxidation-resistant metal such as gold, tungsten, titanium, or nickel. Thus, the CMOS-MEMS switch structure is prevented from failure which may otherwise result from oxidation of the surface electrodes.

Still another object of the present invention is to provide a CMOS-MEMS switch structure whose cantilever beams are configured in such a way that a negative residual stress gradient is created in each cantilever beam. Because of the negative residual stress gradients, both cantilever beams bend downward to facilitate lateral contact between surface electrodes on the beam surfaces. This solves the problem of the prior art that existing process capabilities have prevented the distance between the two cantilever beams of a CMOS-MEMS switch from being reduced.

Yet another object of the present invention is to provide a CMOS-MEMS switch structure which is applicable to a device requiring temporary electrical connection or isolation, such as a microwave circuit switch or an electrostatic generator.

To achieve the above and other objects, the present invention provides a CMOS-MEMS switch structure which includes a first substrate, a second substrate, a first cantilever beam, and a second cantilever beam. The first and second substrates are located opposite each other. The first cantilever beam has a first top surface, extends from the first substrate toward the second substrate, and bends downward. The second cantilever beam has a second top surface, extends from the second substrate toward the first substrate, and bends downward. The first and second substrates can be moved toward each other to connect the first and second top surfaces, and when the first and second substrates are subsequently moved away from each other, the first and second top surfaces are disconnected.

Implementation of the present invention at least involves the following inventive steps:

1. The surface electrodes of the CMOS-MEMS switch structure are made of an oxidation-resistant metal and therefore unlikely to oxidize.

2. The distance between the two cantilever beams of the CMOS-MEMS switch structure is reduced.

3. The CMOS-MEMS switch structure can be used in a device where temporary electrical connection or isolation is required, such as a microwave circuit switch or an electrostatic generator.

The features and advantages of the present invention are detailed hereinafter with reference to the preferred embodiments. The detailed description is intended to enable a person skilled in the art to gain insight into the technical contents disclosed herein and implement the present invention accordingly. A person skilled in the art can easily understand the objects and advantages of the present invention by referring to the disclosure of the specification, the claims, and the accompanying drawings.

BRIEF DESCRIPTION OF THE SEVERAL VIEWS OF THE DRAWINGS

The structure as well as a preferred mode of use, further objects, and advantages of the present invention will be best understood by referring to the following detailed description in conjunction with the accompanying drawings, in which.

DETAILED DESCRIPTION OF THE INVENTION

Figure 1:
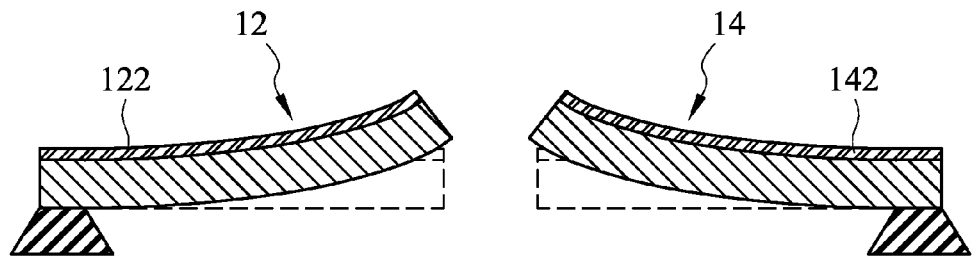
FIG. 1 schematically shows a conventional lateral contact-based CMOS-MEMS switch structure.
Figure 2:
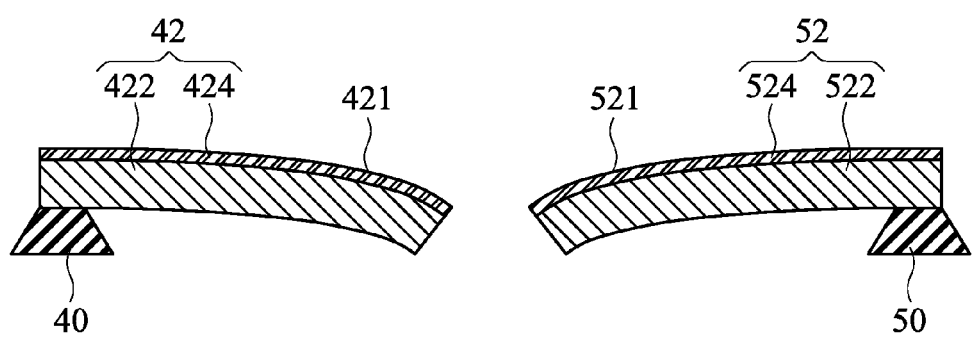
FIG. 2 is a side elevation of a CMOS-MEMS switch structure according to an embodiment of the present invention.

Referring to FIG. 2, a CMOS-MEMS switch structure 200 according to an embodiment of the present invention includes a first substrate 40, a second substrate 50, a first cantilever beam 42, and a second cantilever beam 52. The CMOS-MEMS switch structure 200 is made by a process incorporating both CMOS and MEMS manufacturing processes. For example, different layers of metals and oxides are stacked up using a standard 0.35-micron CMOS process. Then, MEMS element areas are defined on the stacked layers. Once the sacrificial layer arranged in the MEMS element areas is removed by etching, the desired MEMS structures are released. As the integrated CMOS-MEMS manufacturing processes have been developed to a very mature level, a detailed explanation of such processes is omitted, and only the resultant structure is described herein. It should be noted that all the materials of the disclosed CMOS-MEMS switch structure 200 are materials generally used in an integrated CMOS-MEMS manufacturing process.

The first substrate 40 and the second substrate 50—both of which can be silicon substrates—are disposed opposite each other.

The first cantilever beam 42 has a first top surface 421. Also, the first cantilever beam 42 has one end provided on the first substrate 40 such that the first cantilever beam 42 extends from the first substrate 40 toward the second substrate 50. Moreover, the first cantilever beam 42 bends downward while extending toward the second substrate 50. Similarly, the second cantilever beam 52 has a second top surface 521, has one end provided on the second substrate 50, extends from the second substrate 50 toward the first substrate 40, and bends downward. Both the first cantilever beam 42 and the second cantilever beam 52 are MEMS structures released by an etching process.

More specifically, the first cantilever beam 42 includes a first structural layer 422 and a second structural layer 424. The first structural layer 422 is formed on the first substrate 40 and can be an oxidized layer formed on the silicon substrate during the integrated CMOS-MEMS manufacturing process. The second structural layer 424 is formed on the first structural layer 422 and has a top surface serving as the first top surface 421 of the first cantilever beam 42. The second structural layer 424 is a conductive metal layer formed on the first structural layer 422 before the MEMS structure is released by etching. Further, the second structural layer 424 is made of an oxidation-resistant metal, such as gold, tungsten, titanium, or nickel, and can therefore function as a surface electrode of the first cantilever beam 42.

As the first structural layer 422 and the second structural layer 424 are made of different materials, a negative residual stress is generated between the first structural layer 422 and the second structural layer 424. This negative residual stress causes the first cantilever beam 42 to bend downward naturally.

Likewise, the second cantilever beam 52 includes a third structural layer 522 and a fourth structural layer 524. The third structural layer 522 is formed on the second substrate 50 and can also be an oxidized layer. The fourth structural layer 524 is formed on the third structural layer 522 and has a top surface serving as the second top surface 521 of the second cantilever beam 52. The fourth structural layer 524, which is intended as a surface electrode of the second cantilever beam 52, is also made of an oxidation-resistant material such as gold, tungsten, titanium, or nickel. With the third structural layer 522 and the fourth structural layer 524 being formed of different materials, a negative residual stress is also created between the third structural layer 522 and the fourth structural layer 524 and causes the second cantilever beam 52 to bend downward naturally.

As the first cantilever beam 42 and the second cantilever beam 52 are MEMS structures released in the same etching process and use the same materials, the two cantilever beams 42 and 52 preferably have similar downward curvatures. Thus, the first cantilever beam 42 and the second cantilever beam 52 are respectively supported on the first substrate 40 and the second substrate 50 while bending downward and are disposed opposite each other.

With the first cantilever beam 42 and the second cantilever beam 52 both bending downward because of the negative residual stresses, the distance between the first cantilever beam 42 and the second cantilever beam 52 is reduced, which has been impossible with existing process capabilities. Moreover, as the first cantilever beam 42 and the second cantilever beam 52 are structurally designed to bend downward, not only can the first top surface 421 of the first cantilever beam 42 and the second top surface 521 of the second cantilever beam 52 make lateral contact easily, but also the area of contact between the first top surface 421 and the second top surface 521 is increased.

In addition, since the second structural layer 424 of the first cantilever beam 42 and the fourth structural layer 524 of the second cantilever beam 52 are both made of an oxidation-resistant metal and serve respectively as the surface electrodes of the cantilever beams 42 and 52, failure to make electrical connection between the two surface electrodes while the electrodes are actually in physical contact is prevented, which failure, however, is highly probable with the prior art once the surface electrodes become oxidized. Apart from that, as the oxidation-resistant metal can be readily deposited on the oxidized layers (i.e., the first structural layer 422 and the third structural layer 522) during the integrated CMOS-MEMS manufacturing process, the CMOS-MEMS switch structure 200 can be made without an overly complicated procedure.

Figure 3A:
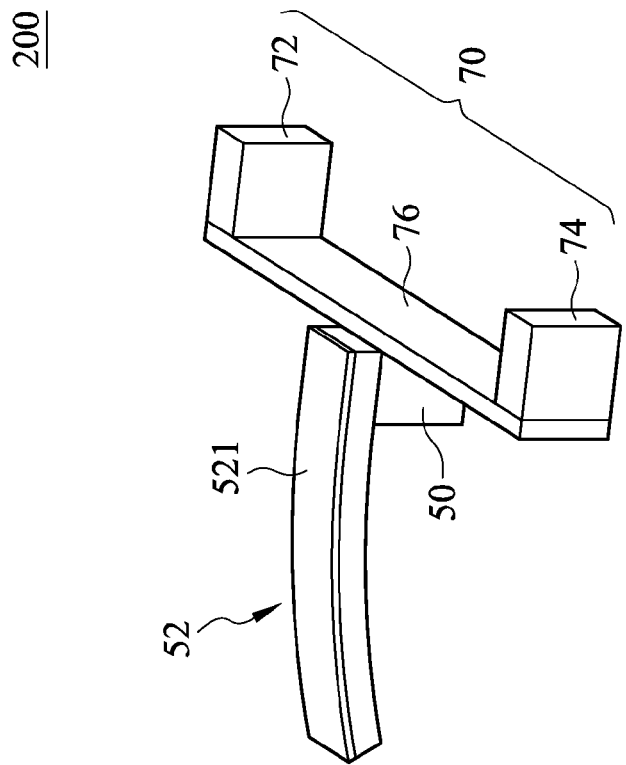
FIG. 3A is a perspective view of a CMOS-MEMS switch structure according to an embodiment of the present invention.
Figure 3B:
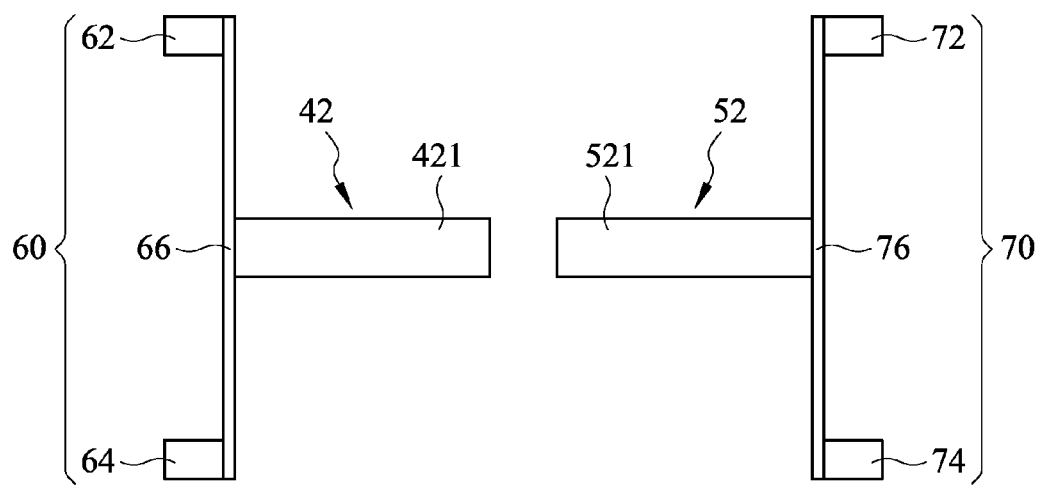
FIG. 3B is a top view of the CMOS-MEMS switch structure depicted in FIG. 3A.

Referring to FIG. 3A and FIG. 3B, the first cantilever beam 42 and the second cantilever beam 52, once completed, are in an opened state in which the cantilever beams 42 and 52 are not in contact with each other. To enable electrical connection between the surface electrodes of the first cantilever beam 42 and of the second cantilever beam 52, the CMOS-MEMS switch structure 200 further includes a first operating member 60 and a second operating member 70.

The first operating member 60 can be divided into a first end portion 62, a second end portion 64, and a first connecting portion 66. The second end portion 64 is provided at the opposite end of the first end portion 62 such that the first end portion 62 and the second end portion 64 are located at the two opposite ends of the first operating member 60 respectively. The first connecting portion 66 lies in a central part of the first operating member 60 and is configured to connect the first end portion 62 and the second end portion 64. Moreover, the first connecting portion 66 is provided adjacent to the first substrate 40.

Similarly, the second operating member 70 includes a third end portion 72, a fourth end portion 74, and a second connecting portion 76. The third end portion 72 is provided at the opposite end of the fourth end portion 74 such that the third end portion 72 and the fourth end portion 74 are located at the two opposite ends of the second operating member 70 respectively. The second connecting portion 76 connects the third end portion 72 and the fourth end portion 74 and is provided adjacent to the second substrate 50.

Figure 4A:
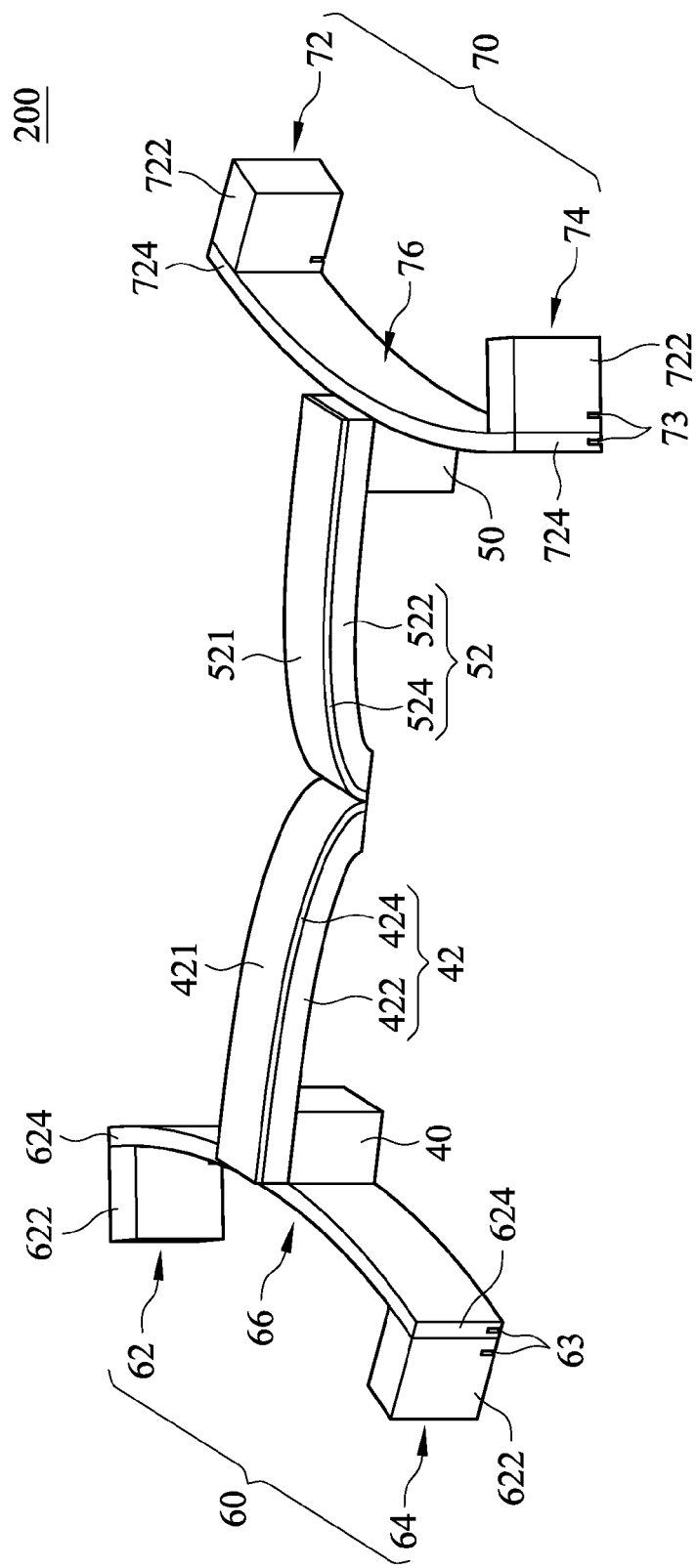
FIG. 4A is a perspective view showing lateral contact between the surface electrodes of a CMOS-MEMS switch structure according to an embodiment of the present invention.
Figure 4B:
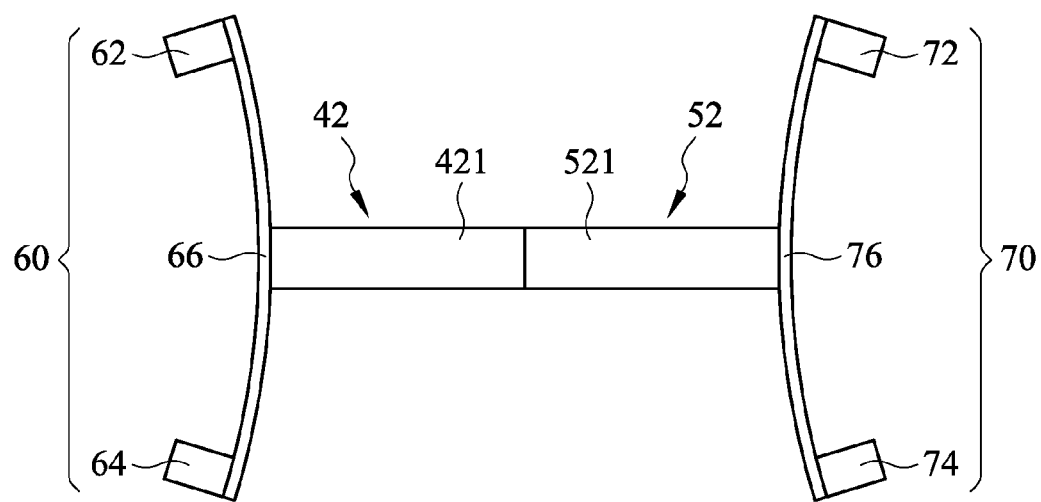
FIG. 4B is a top view of the CMOS-MEMS switch structure depicted in FIG. 4A.

With reference to FIG. 4A and FIG. 4B, when the first operating member 60 is operated and thereby deformed, the first substrate 40 is pushed by the first operating member 60 toward the second substrate 50. As the first cantilever beam 42 has one end fixed to the first substrate 40, the displacement of the first substrate 40 toward the second substrate 50 drives the first cantilever beam 42 toward the second cantilever beam 52.

Alternatively, when the second operating member 70 is operated and thereby deformed, the second substrate 50 is pushed by the second operating member 70 toward the first substrate 40. As the second cantilever beam 52 also has one end fixed to the second substrate 50, the displacement of the second substrate 50 toward the first substrate 40 causes the second cantilever beam 52 to move toward the first cantilever beam 42.

The first substrate 40 and the second substrate 50 can be moved toward each other so that the first top surface 421 of the first cantilever beam 42 and the second top surface 521 of the second cantilever beam 52 are brought into contact and are electrically connected, thereby causing the CMOS-MEMS switch structure 200 to enter a closed state. Once the first operating member 60 or the second operating member 70 resumes its original shape, the pushing force acting on the first substrate 40 or the second substrate 50 is gone. As a result, the first substrate 40 and the second substrate 50 move away from each other, and the first top surface 421 and the second top surface 521 are disconnected both physically and electrically, thereby bringing the CMOS-MEMS switch structure 200 into an opened state.

In one embodiment, the first operating member 60 or the second operating member 70 is deformed by an axial compression force parallel to the first operating member 60 and the second operating member 70. For instance, an axial compression force can be applied to the first end portion 62 and the second end portion 64 of the first operating member 60 so that the first connecting portion 66 is bent under the axial compression force and thereby pushes the first substrate 40 toward the second substrate 50. Similarly, an axial compression force can be applied to the third end portion 72 and the fourth end portion 74 of the second operating member 70 to bend the second connecting portion 76 and thereby push the second substrate 50 toward the first substrate 40.

The axial compression force can be generated by thermal expansion. For example, referring to FIG. 4A and FIG. 4B, the first end portion 62 and the second end portion 64 of the first operating member 60 are composed of a fifth structural layer 622 and a sixth structural layer 624 respectively, and the fifth structural layer 622 and the sixth structural layer 624 are made of materials having significantly different thermal expansion coefficients. When the first operating member 60 is heated, the large difference between the thermal expansion coefficients of the fifth structural layer 622 and the sixth structural layer 624 results in an axial compression force acting between the fifth structural layer 622 and the sixth structural layer 624. Because of the axial compression force, the first operating member 60 is bent and pushes the first substrate 40, thereby driving the first cantilever beam 42 toward the second cantilever beam 52.

Likewise, the third end portion 72 and the fourth end portion 74 of the second operating member 70 are composed of a seventh structural layer 722 and an eighth structural layer 724 respectively, wherein the seventh structural layer 722 and the eighth structural layer 724 are also made of different materials. Thus, when the second operating member 70 is heated, an axial compression force is generated between the seventh structural layer 722 and the eighth structural layer 724 and bends the second operating member 70. As a result, the second operating member 70 pushes the second substrate 50 and thereby moves the second cantilever beam 52 toward the first cantilever beam 42.

In one embodiment, metal wires 63 and 73 are embedded in the first operating member 60 and the second operating member 70 respectively (see FIG. 4A), so as to heat and thereby bend the first operating member 60 and the second operating member 70.

In yet another embodiment, only one of the first operating member 60 and the second operating member 70 is subjected to an axial compression force and bent; in consequence, only one of the first substrate 40 and the second substrate 50 is moved (not shown). In a different embodiment, the first operating member 60 and the second operating member 70 are simultaneously heated to generate an axial compression force. In that case, both the first operating member 60 and the second operating member 70 will bend, and the first connecting portion 66 and the second connecting portion 76 will push the first substrate 40 and the second substrate 50 respectively, causing the first cantilever beam 42 and the second cantilever beam 52 to move toward each other until the second structural layer 424 and the fourth structural layer 524 are in electrical contact, which brings the CMOS-MEMS switch structure to the closed state.

Hence, the first operating member 60 or the second operating member 70 can be bent by an axial compression force so as to move the first substrate 40 or the second substrate 50, connect the surface electrodes on the first cantilever beam 42 and on the second cantilever beam 52 (i.e., the second structural layer 424 and the fourth structural layer 524), and thereby close the CMOS-MEMS switch structure 200. Once the axial compression force is removed, the surface electrodes on the first cantilever beam 42 and on the second cantilever beam 52 (i.e., the second structural layer 424 and the fourth electrical layer 524) are disconnected to open the CMOS-MEMS switch structure 200.

The present invention not only solves the various problems of the conventional lateral contact-based CMOS-MEMS switch structure 100, but also is compatible with CMOS manufacturing processes and therefore allows easy integration between circuit structures and MEMS structures. Besides, the CMOS-MEMS switch structure provided by the present invention is a highly sensitive compact MEMS element which can be further applied to microwave circuit switches, electrostatic generators, and other devices that require temporary electrical connection or isolation.

The foregoing embodiments are provided to demonstrate the features of the present invention so that a person skilled in the art can understand the contents disclosed herein and implement the present invention accordingly. The embodiments, however, are not intended to limit the scope of the present invention, which is defined only by the appended claims. Therefore, all equivalent changes or modifications which do not depart from the spirit of the present invention should fall within the scope of the appended claims.

What is claimed is:

1. A CMOS (complementary metal-oxide-semiconductor)—MEMS (microelectromechanical system) switch structure, comprising:
   a first substrate and a second substrate located opposite each other;
   a first cantilever beam extending from the first substrate toward the second substrate, the first cantilever beam comprises a first structural layer formed on the first substrate, and a second structural layer formed on the first structural layer and having a top surface serving as the first top surface, wherein the first structural layer and the second structural layer are made of different materials such that a residual stress is generated between the first structural layer and the second structural layer and causes the first cantilever beam to bend downward; and a second cantilever beam extending from the second substrate toward the first substrate, the second cantilever beam comprises:

a third structural layer formed on the second substrate, and a fourth structural layer formed on the third structural layer and having a top surface serving as the second top surface, wherein the third structural layer and the fourth structural layer are made of different materials such that a residual stress is generated between the third structural layer and the fourth structural layer and causes the second cantilever beam to bend downward, wherein the first substrate and the second substrate are movable toward each other to connect the first top surface and the second top surface, and the first substrate and the second substrate are movable away from each other so that the first top surface and the second top surface are disconnected.

2. The CMOS-MEMS switch structure of claim 1, wherein the material of which the second structural layer is made includes an oxidation-resistant metal.

3. The CMOS-MEMS switch structure of claim 1, wherein the material of which the second structural layer is made includes gold, tungsten, titanium, or nickel.

4. The CMOS-MEMS switch structure of claim 1, wherein the first structural layer is an oxidized layer.

5. The CMOS-MEMS switch structure of claim 1, wherein the material of which the fourth structural layer is made includes an oxidation-resistant metal.

6. The CMOS-MEMS switch structure of claim 1, wherein the material of which the fourth structural layer is made includes gold, tungsten, titanium, or nickel.

7. The CMOS-MEMS switch structure of claim 1, wherein the third structural layer is an oxidized layer.

8. The CMOS-MEMS switch structure of claim 1, further comprising a first operating member operable to move the first substrate toward the second substrate, the first operating member comprises:

a first end portion, a second end portion provided at an opposite end of the first end portion, and a first connecting portion connecting the first end portion and the second end portion and provided adjacent to the first substrate, wherein when the first end portion and the second end portion are subjected to an axial compression force, the axial compression force bends the first connecting portion and thereby pushes the first substrate toward the second substrate.

9. The CMOS-MEMS switch structure of claim 8, wherein each of the first end portion and the second end portion comprises a fifth structural layer and a sixth structural layer, wherein the fifth structural layer and the sixth structural layer are made of different materials such that when the first operating member is heated, the axial compression force is generated between the fifth structural layer and the sixth structural layer.

10. The CMOS-MEMS switch structure of claim 1, further comprising a second operating member operable to move the second substrate toward the first substrate, the second operating member comprises:

a third end portion, a fourth end portion provided at an opposite end of the third end portion, and a second connecting portion connecting the third end portion and the fourth end portion and provided adjacent to the second substrate, wherein when the third end portion and the fourth end portion are subjected to an axial compression force, the axial compression force bends the second connecting portion and thereby pushes the second substrate toward the first substrate.

11. The CMOS-MEMS switch structure of claim 10, wherein each of the third end portion and the fourth end portion comprises a seventh structural layer and an eighth structural layer, wherein the seventh structural layer and the eighth structural layer are made of different materials such that when the second operating member is heated, the axial compression force is generated between the seventh structural layer and the eighth structural layer.

12. The CMOS-MEMS switch structure of claim 1, wherein the first substrate and the second substrate are silicon substrates.

* * * * *